(12) United States Patent
Van Der Wel et al.

(10) Patent No.: US 7,936,193 B2
(45) Date of Patent: May 3, 2011

(54) MULTI-PHASE CLOCK SYSTEM

(75) Inventors: Arnoud P. Van Der Wel, Vught (NL); Gerrit W. Den Besten, Eindhoven (NL); Adrianus J. Van Tuijl, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/596,872

(22) PCT Filed: Apr. 24, 2008

(86) PCT No.: PCT/IB2008/051578
§ 371 (c)(1),
(2), (4) Date: Oct. 21, 2009

(87) PCT Pub. No.: WO2008/132669
PCT Pub. Date: Nov. 6, 2008

(65) Prior Publication Data
US 2010/0085093 A1    Apr. 8, 2010

(30) Foreign Application Priority Data
May 1, 2007    (EP) .................................... 07107284

(51) Int. Cl.
*H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | |
|---|---|---|---|
| 4,637,018 A | 1/1987 | Flora et al. | |
| 5,012,142 A | 4/1991 | Sonntag | |
| 5,122,679 A | 6/1992 | Ishii et al. | |
| 6,097,765 A * | 8/2000 | Corrigan et al. | 375/305 |
| 6,606,365 B1 * | 8/2003 | Chen | 375/376 |
| 7,369,003 B2 * | 5/2008 | Hagelin | 331/116 M |
| 7,403,559 B1 * | 7/2008 | Fisher et al. | 375/150 |
| 7,446,619 B2 * | 11/2008 | Partridge et al. | 331/156 |
| 7,786,776 B2 * | 8/2010 | Yamakido et al. | 327/158 |
| 2007/0247245 A1 * | 10/2007 | Hagelin | 331/154 |
| 2007/0247246 A1 * | 10/2007 | Hagelin | 331/154 |
| 2007/0290763 A1 * | 12/2007 | Partridge et al. | 331/154 |
| 2007/0290764 A1 * | 12/2007 | Partridge et al. | 331/176 |
| 2008/0007362 A1 * | 1/2008 | Partridge et al. | 331/176 |
| 2009/0256642 A1 * | 10/2009 | Lesso | 331/1 A |

(Continued)

FOREIGN PATENT DOCUMENTS

| | | |
|---|---|---|
| EP | 1422826 A1 | 5/2004 |
| WO | 03/063337 A1 | 7/2003 |

OTHER PUBLICATIONS

Wu, et al; "A Low-Jitter Skew-Calibrated Multi-Phase Clock Generator for Time-Interleaved Applications"; Proceedings of the ISSCC—Session 25—Clock Generation and Distribution (2001); pp. 396-397 & 470.

(Continued)

*Primary Examiner* — Lincoln Donovan
*Assistant Examiner* — Adam D Houston

(57) ABSTRACT

The invention relates to multi-phase clock system for receiving a plurality of clock signals ($CLK_{o-n}$) comprising actual time events (aTE) defining different clock phases, the clock signals all having a same clock frequency but different clock phases, the system further arranged for receiving a reference clock signal (REFCLK) for providing reference time events (rTE) for the plurality of clock signals ($CLK_{o-n}$), the reference clock signal (REFCLK) having a reference frequency different from the clock frequency, the reference frequency being selected such that each one of the subsequent reference time events (rTE) coincides with a desired time event (dTE) for a single one of the plurality of clock signals ($CLK_{o-n}$).

20 Claims, 9 Drawing Sheets

U.S. PATENT DOCUMENTS

2010/0295585 A1* 11/2010 Yamakido et al. ............ 327/149

OTHER PUBLICATIONS

Pottbacker, et al; "A SI Bipolar Phase and Frequency Detector IC for Clock Extraction Up to 8 Gb/S"; IEEE J. Solid-State Circuits, vol. 27, No. 12 (Dec. 1992); pp. 1747-1751.

Chen, et al; "A Self-Calibrated Multiphase DLL-Based Clock Generator"; VLSI Design, Automation and Test, 2007; Apr. 1, 2007; pp. 1-4; XP031178735; ISBN: 978-1-4244-0582-4.

International Search Report for Application No. PCT/IB2008/051578.

* cited by examiner

MULTI-PHASE CLOCK SYSTEM

FIELD OF THE INVENTION

The invention relates to a multi-phase clock system for receiving a plurality of clock signals comprising actual time events, the clock signals all having a same clock frequency but different clock phases. The invention further relates to a time-interleaved system comprising a multi-phase clock system, and to a method of receiving multi-phase clocks.

BACKGROUND OF THE INVENTION

Multi-phase clock systems are known, especially in time-interleaved applications. Time-interleaving is a technique which finds wide application in circuit design, for example, in Analog-to-Digital Converters (ADC's) and clock and data recovery (CDR) circuits. This technique entails the use of several parallel data processing paths, each with limited speed.

In essence, interleaving means that chip area is spent in return for speed of operation. Where accurate and fast operation is required, interleaving allows the combination of accurate but slow paths into a system that becomes both accurate and fast. In interleaved systems, a multi-phase clock is required. The accuracy of the system is limited by the time accuracy of the multi-phase clock. In particular, differences between the actual and ideal timing of a clock edge (skew) is a limiting factor. Skew may be caused by mismatch in the multi-phase oscillator, but it may also be caused by layout asymmetry, since it is non-trivial to generate a perfectly symmetrical layout with identical delays for all paths in an interleaved system.

To generate a multi-phase clock, a high frequency clock can be divided down to a lower frequency clock with many phases. Although the phase accuracy of this method is acceptable, it is a "power-hungry" approach, requiring many high-speed dividers and retiming flip-flops. Moreover, at very high frequencies, it may not be possible to generate the required HF signal at all. An alternative approach for producing a multiphase clock is to make a multi-phase ring oscillator. This is advantageous because the interval between two active clock edges may be very small (the propagation delay of a gate). However, this approach is limited by the accuracy by which a large number of phases can be produced, since some timing errors in the ring will accumulate.

There are many different ways in which the skew in an interleaved system can be measured and removed by calibration. In interleaved ADC's, skew is sometimes measured by spectral analysis of the digital output when the input is known. There are other methods of measuring and calibrating skew known in the prior art.

A multi-phase clock system having skew measurement and calibration is disclosed in L. Wu and J. William C. Black. "*A low-jitter skew-calibrated multi-phase clock generator for time-interleaved applications*", Proceedings of the ISSCC, 2001, page 25.3. This document discloses a multiphase clock generator comprising a 4-stage differential ring-oscillator which produces 8 different clock phases at its output. Each output is provided with an additional delay adjustment unit. The output of only one of the delay adjustment units is coupled back into a phase detector which compares this output signal with a reference clock. The phase detector steers a chargepump, which drives the loop filter, which drives the ring oscillator, thus effectively closing the loop of a phase-locked loop. Coarse tuning of the ring-oscillator is done by the output signal of the loop filter which is used as a global control voltage for all stages of the ring-oscillator. Fine tuning of individual clock phases is done by means of individual control voltages, which are produced by delay comparators, wherein the delay comparators are arranged for comparing time intervals between selected subsets of the individual clock phases in order to regulate the actual time events towards the desired time events. The fifth phase of the multi-phase clock is de-skewed by comparing a first time interval between the first phase and the fifth phase with a second time interval between the fifth phase and the first phase of the next clock cycle; if the first interval is longer than the second interval, the delay of the additional delay adjustment unit is increased, and visa versa. The third phase is similarly de-skewed by comparing a third time interval between the first phase and the third phase with a fourth time interval between the third phase and the fifth phase, whereafter the delay adjustment unit of the third clock phase is adjusted accordingly. For the seventh phase, the time interval between the fifth phase and the seventh phase is compared with the time interval between the seventh phase and the first phase of the next clock period. De-skewing of the second, fourth, and sixth clock phase happens in a manner similar to that described above.

A disadvantage of the known multi-phase clock system is that it is not suitable for high frequencies. The circuit's operation relies on continuously measuring short time intervals between the individual clock phases within a single clock period and continuously comparing them to generate the appropriate references for the same clock phases. The measurement of time intervals between the individual clock phases becomes increasingly difficult at higher frequencies and also becomes relatively less accurate. As a consequence, the known circuit has a maximum operational clock frequency that is limited by the accuracy of the time interval measurement.

SUMMARY OF THE INVENTION

It is an object of the invention to provide an alternative multi-phase clock system for receiving a plurality of clock signals which is suitable for high-speed operation.

The invention is defined by the independent claims. The dependent claims define advantageous embodiments.

According to a first aspect of the invention the object is achieved in that a multi-phase clock system for receiving a plurality of clock signals comprising actual time events, the clock signals all having a same clock frequency but different clock phases is provided, wherein the system is further arranged for receiving a reference clock signal for providing reference time events for the plurality of clock signals, the reference clock signal having a reference frequency different from the clock frequency, the reference frequency being selected such that each one of the subsequent reference time events coincides with a desired time event for a single one of the plurality of clock signals, the system comprising:

- a comparator arranged for sequentially comparing corresponding ones of the reference time events and the actual time events for sequentially generating a plurality of timing difference indicators, and
- a de-skew circuit for de-skewing a corresponding one of the plurality of clock signals with respect to the reference clock signal in response to the corresponding timing difference indicator to obtain corrected clock signals having actual time events coinciding with the corresponding reference time events.

The effect of the measures according to the invention is that the reference clock signal determines the desired time events for the plurality of clock signals. Moreover, the reference frequency of the reference clock signal is selected such that the time events of the reference clock signal coincide with a different one of the plurality of clock signals every reference clock period. Since the reference clock signal may be provided, using conventional techniques, with a very large accuracy in terms of frequency (and phase), it provides the desired time events for each of the plurality of clock signals, and comparing the reference clock signal to those clock signals allows adjustment of the actual time events of the respective clock signals towards their desired location (de-skewing). An important aspect of the invention is that, in comparison with the known multi-phase clock system, the measurement of very short time intervals for producing reference time events has been replaced by the accurate control of a reference frequency for producing reference time events for the plurality of clock signals.

An additional advantage of the multi-phase clock system of the invention is that it is suitable for any number of clock phases (two and higher). The known multi-phase clock system only works for multi-phase clock systems wherein the number of clock phases equals a power of two, which is an inherent consequence of the method of creating reference time events by dividing measured time intervals into two equal lengths.

An embodiment of the multi-phase clock system comprises a phase comparator for at least once comparing the phase of one of the plurality of clock signals and the phase of the reference clock signal, and comprises a phase shifter for at least once subsequently matching the phase of the reference clock signal with the phase of the one of the plurality of clock signals. The effect of these additional features is that a possible steady-state phase error between the reference clock signal and the plurality of clock signals is removed, which saves unnecessary subsequent phase adjustments by the de-skew circuit. It is even more advantageous if the phase comparator and phase shifter operate at a plurality of reference time events, for example once every certain number of clock cycles. By doing so dynamic variations in the steady-state phase error may be removed as well, rendering even more phase adjustments unnecessary.

Another embodiment of the multi-phase clock system comprises a reference oscillator for generating the reference clock signal. The usage of an oscillator for generating the reference clock signal provides the advantage that a reference clock signal no longer needs to be provided to the system. Instead, the reference clock signal may be generated at the location where it is required. This saves the need for routing the reference clock signal towards those locations.

The last mentioned embodiment may be further improved if the system comprises a phase-locked loop comprising the reference oscillator, the phase comparator and the phase shifter, the phase comparator being arranged for comparing the reference clock signal to one of the plurality of clock signals for generating one of the plurality of timing difference indicators, the phase shifter comprising a controller for tuning the reference oscillator in response to the one of the plurality of timing difference indicators. This embodiment is advantageous, because the phase-locked loop provides a convenient way of matching the phase of reference clock signal with one of the plurality of clock signals.

In one variant of the last mentioned embodiment the controller comprises a charge pump and a loop filter, the charge pump receiving the further timing difference indicator from the phase comparator, the loop filter receiving an output signal from the charge pump and producing a reference control signal for tuning the reference oscillator.

An advantageous variant of this embodiment comprises a gating circuit arranged between the output of the phase comparator and the charge pump for facilitating the matching of the phase of the reference clock signal with the phase of the one of the plurality of clock signals at the at least one of the reference time events. The gating circuit thus effectively opens the loop of the phase-locked loop at time intervals where the phase matching is not required.

An embodiment of the multi-phase clock system comprises means for measuring the clock frequency of one of the plurality of clock signals and fixing the reference frequency to a fixed factor times the clock frequency. The use of those means provides a convenient solution for enabling the reference clock to be compared with a different one of the plurality of clock signals in subsequent clock periods.

In an advantageous implementation of the last mentioned embodiment the means for fixing the reference frequency comprises a frequency-locked loop comprising a frequency difference detector arranged for comparing a first frequency with a second frequency for generating a frequency difference indicator, the frequency-locked loop further comprising a further controller for tuning the frequency of the reference oscillator in response to the frequency difference indicator, the system further comprising a divider for generating the first frequency having a first integer ratio with the clock frequency of one of the plurality of clock signals, and a further divider for generating the second frequency having a second integer ratio with the reference frequency, wherein a ratio of the first integer ratio and the second integer ratio determines the fixed factor. This implementation is advantageous, because the frequency-locked loop provides a convenient way of fixing the frequency of the reference clock signal to one of the clock signals. Another advantage of the use of a frequency-locked loop is that it ensures adaptation of the system to relatively slow variations in the clock frequency, which may, for example, occur due to clock jitter. Expressed differently, the frequency locked loop enables the adaptation of the reference time events (coarse-tuning), while the de-skew circuit arranges for the de-skewing of the individual clock signal with respect to these reference time events (fine-tuning)

An embodiment of the multi-phase clock system comprises a multi-phase oscillator for generating the plurality of clock signals. A plurality of clock signals having different clock phases may be advantageously generated by a single multi-phase oscillator. An advantage of such an oscillator is that the multi-phase oscillator may be easily designed such that the different phases are equally distributed over one clock period. Furthermore, in conventional designs of a multi-phase oscillator, for example an n-stage ring-oscillator, the phases of the individual clock signals may be easily adapted by the de-skew circuit, for example by adapting the supply voltage of the stages or by adapting the output node capacitances of the stages.

In an improvement of the last-mentioned embodiment the comparator further comprises a plurality of phase detectors for the remainder of the plurality of clock signals which are not connected to the phase comparator, each phase detector being arranged for detecting a phase difference between the respective clock signal and the reference clock signal for producing the plurality of timing difference indicators. This implementation conveniently provides an indication of the actual time events of the plurality of clock signals, which may advantageously be used for de-skewing the clock signals.

In a further improvement the de-skew circuit comprises a phase control unit arranged for individually controlling the phases of the multi-phase oscillator in response to the plurality of timing difference indicators, wherein the multi-phase oscillator, the phase detectors and the phase control unit form a further phase-locked loop, wherein the reference clock signal that is provided to the phase detectors is used as the reference signal for the further phase-locked loop. The use of a phase-locked loop provides a convenient way of de-skewing the clock signals generated by the multi-phase oscillator.

Preferably, the last mentioned embodiment comprises a further gating circuit arranged between each output of the plurality of phase detectors and the phase control unit for facilitating the sequential comparison and de-skewing of the clock signals.

In a first main variant of all above-mentioned embodiments the reference frequency is lower than the clock frequency of the clock signals. A lower reference frequency results in a lower power dissipation of the multi-phase clock system.

In an advantageous embodiment of the first main variant the reference frequency equals the clock frequency of the clock signals multiplied by $n/(n+1)$, wherein n represents the number of clock signals. The consequence of this feature is that, when the phases of the plurality of clock signals are equally distributed over the clock period, the reference clock coincides with a next phase in each subsequent clock period of the reference clock. The individual clock signals cycled through (and de-skewed) in an incremental order.

In a second main variant of all above-mentioned embodiments the reference frequency is higher than the clock frequency of the clock signals. A higher reference frequency results in a faster de-skew performance of the multi-phase clock system. Expressed differently, the system then needs less clock periods of the multi-phase clock to reach the situation where the actual time events of the clock signals coincide with the reference time events.

In an advantageous embodiment of the first main variant the reference frequency equals the clock frequency of the clock signals multiplied by $(n+1)/n$, wherein n represents the number of clock signals. The consequence of this feature is that, when the phases of the plurality of clock signals are equally distributed over the clock period, the reference clock coincides with a previous phase in each subsequent clock period of the reference clock. The individual clock signals are cycled through in a decremental order.

The invention further relates to a time-interleaved system comprising the multi-phase clock system for providing a multi-phase clock, and a processing unit for receiving the multi-phase clock. Time-interleaved systems greatly benefit from a multi-phase clock having a large time accuracy, which is provided by the multi-phase clock system in accordance with the invention. Time-interleaved systems generally need an accurate multi-phase clock. The really strong point of the invention is that it may use the track-and-hold (T&H) circuits of the time-interleaved system for skew calibration. Clock-and-data recovery (CDR) systems and analog-to-digital converters (ADC), for example, already comprise T&H-circuits. Using the same T&H-circuits for skew calibration enables the removal of all clock skew including the clock skew generated by the T&H circuits themselves.

In one embodiment the time-interleaved system comprises a clock-and-data-recovery circuit arranged for receiving the multi-phase clock. In other embodiments the time-interleaved system comprises an analog-to-digital converter or a digital-to-analog converter for receiving the multi-phase clock.

The invention further relates, in a second aspect of the invention to a method of de-skewing a plurality of clock signals comprising actual time events defining different clock phases, the clock signals all having a same clock frequency but different clock phases, the method comprising the steps of:

receiving a reference clock signal for providing reference time events for the plurality of clock signals, the reference clock signal having a reference frequency different from the clock frequency, the reference frequency being selected such that each one of the subsequent reference time events coincide with a desired time event for a single one of the plurality of clock signals;

sequentially comparing corresponding ones of the reference time events and the actual time events for sequentially generating a plurality of timing difference indicators, and de-skewing a corresponding one of the plurality of clock signals with respect to the reference clock signal in response to the corresponding timing difference indicator to obtain corrected clock signals having actual time events coinciding with the corresponding reference time events.

The method provides a convenient way of de-skewing a plurality of clocks having different phases using a single reference clock.

These and other aspects of the invention are apparent from and will be elucidated with reference to the embodiments described hereinafter.

DETAILED DESCRIPTION OF THE PREFERRED EMBODIMENT

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

Figure 1A:
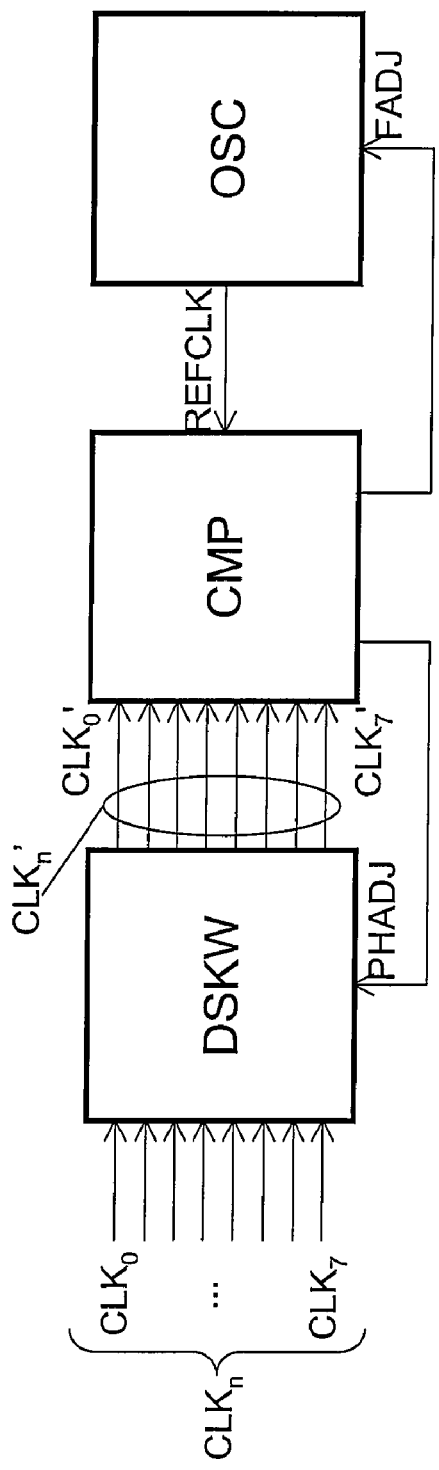
FIG. 1a shows a multi-phase clock system in accordance with a first embodiment of the invention.
Figure 1B:
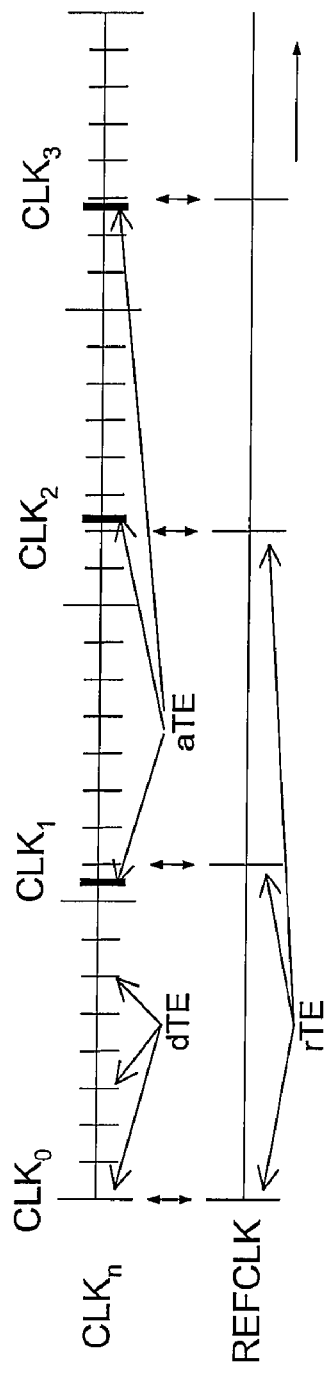
FIG. 1b shows a timing diagram of the multi-phase clock system of FIG. 2a, which illustrates the operating principle of the first embodiment of the invention.

Referring to FIGS. 1a and 1b, FIG. 1a shows a multi-phase clock system in accordance with a first embodiment of the invention and FIG. 1b shows a timing diagram, which illustrates the operating principle of the first embodiment of the invention. The multi-phase clock system receives an external clock $CLK_n$ comprising a plurality of clock signals $CLK_{0-7}$, which in this example constitute an 8-phase clock (n=8). Whenever the phrase "multi-phase clock" is mentioned in this description a plurality of clock signals is meant having a same clock frequency but different clock phases, wherein the desired time events of the individual clock signals are equally distributed over one clock period. The external 8-phase clock $CLK_n$ is supplied to a de-skew circuit DSKW arranged for correcting the phases of the individual clock signals $CLK_{0-(n-1)}$ under control of a timing difference indicator PHADJ for producing a corrected multi-phase clock $CLK_n'$. A comparator CMP sequentially compares reference time events rTE of a reference clock signal REFCLK with actual time events aTE of each of the plurality of corrected clock signals $CLK_{0-7}'$ and produces a corresponding timing difference indicator PHADJ after each comparison which is supplied to the de-skew circuit DSKW for adjusting the actual time events aTE of the respective clock signals to their 'ideal' or desired time events dTE (desired phases). "Corrected multi-phase clock $CLK_n'$" is not meant to imply that all individual clock signals have reached their desired phases, or that all actual time events aTE coincide with the desired events dTE. Instead, the "corrected multi-phase clock $CLK_n'$" is a version of the external reference clock $CLK_n$, wherein the phase differences between the individual clock signals $CLK_{0-(n-1)}$ may have been corrected.

In this example, the sequential comparison is achieved in that the reference frequency of the reference clock signal REFCLK has a frequency, which is n/n+1 times the frequency of the clock signals $CLK_n$. In this way, the reference time events of the reference clock signal REFCLK coincide with a different clock signal $CLK_x$ every reference clock period. For completeness, the words clock signal and clock phase are used interchangeably, but they both refer to an individual phase of the multi-phase clock. Using conventional techniques like shielding, power supply decoupling, electrical isolation of substrate, and the like, the reference clock signal REFCLK is designed with a constant and stable frequency, for providing the 'ideal' or desired time events dTE for the plurality of clock signals.

In this example, the reference clock signal REFCLK is generated by a reference oscillator OSC, which is controlled by a frequency difference indicator coming from the comparator. Alternatively, the reference clock signal REFCLK may be generated externally and fed to the multi-phase clock system. In any case, it is important that the reference clock REFCLK is as accurate as possible in order to provide the 'ideal' or desired time events for the plurality of clock signals $CLK_n$.

In this example, the reference clock has a reference frequency, which is n/n+1 (8/9) times the clock frequency of the clock signals. However, many other frequencies are also possible. If the reference clock period is defined as $T_{ref}$, and the clock period of the clock signals is defined as $T_{clk}$, then the relation between those parameters may be defined by:

$$T_{ref} = m/n * T_{clk}$$

wherein n defines the number of clock signal phases having distributed phase, and wherein m must be an integer (zero excluded), which may not be an integer multiple of n, and m may also not be a multiple of a factor of n (exception: m=1).

In a first example where the number of clock signals is 8, then n=8 and the allowable clock periods for $T_{ref}$ are:

$$m=1 \rightarrow Tref=1/8*T_{clk}$$

$$m=3 \rightarrow Tref=3/8*T_{clk}$$

$$m=5 \rightarrow Tref=5/8*T_{clk}$$

$$m=7 \rightarrow Tref=7/8*T_{clk}$$

$$m=9 \rightarrow Tref=9/8*T_{clk}$$

$$m=[11, 13, 15, \ldots] \; T_{ref}=m/8*T_{clk}$$

In another example where the number of clock signals is 5, then n=5 and the allowable clock periods for $T_{ref}$ are:

$$m=1 \rightarrow Tref=1/5*T_{clk}$$

$$m=2 \rightarrow Tref=2/5*T_{clk}$$

$$m=3 \rightarrow Tref=3/5*T_{clk}$$

$$m=4 \rightarrow Tref=4/5*T_{clk}$$

$$m=6 \rightarrow Tref=6/5*T_{clk}$$

$$m=[7, 8, 9, 11, 12, \ldots] \; T_{ref}=m/8*T_{clk}$$

As can be deduced from the above formula and the example, the number of possibilities for the reference clock period $T_{ref}$ when it is shorter than the clock period of the clock signals $T_{clk}$ is limited to n−1, whereas the number of possibilities for the reference clock period $T_{ref}$ when it is longer than the clock period of the clock signals $T_{clk}$ is theoretically unlimited.

When the number of clock phases is a prime number, then m may be any number except 1 and n.

Whenever the word "time-event" is used in this description it is meant that the respective signal exhibits a change, which may be used to trigger other events, wherein the change may comprise a rising-edge as well as a falling-edge in the case of a single-ended signal. In case of differential signals, the change is present on both signals, which implies both a rising as well as a falling edge at the same instant. In line with this definition, the word "signal" in this description comprises differential signals as well as single-ended signals.

Figure 2A:
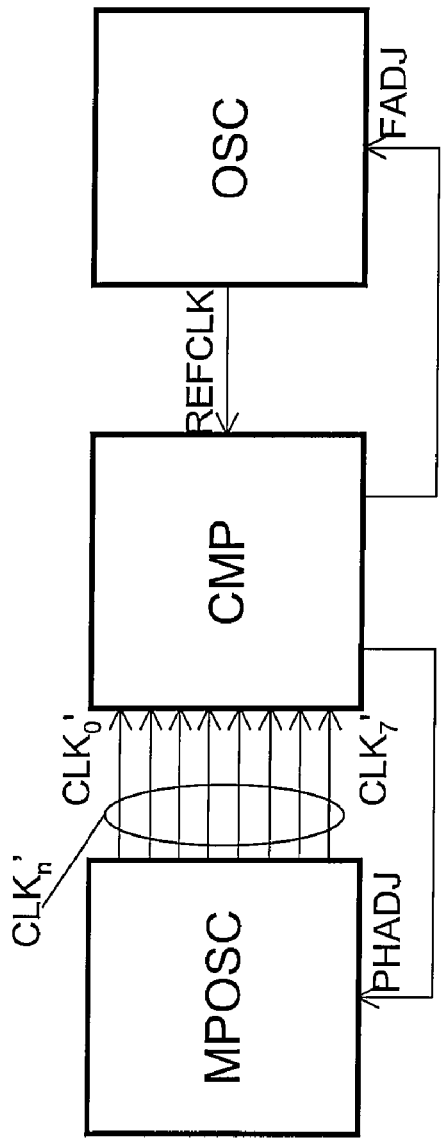
FIG. 2a shows a multi-phase clock system in accordance with a second embodiment of the invention.
Figure 2B:
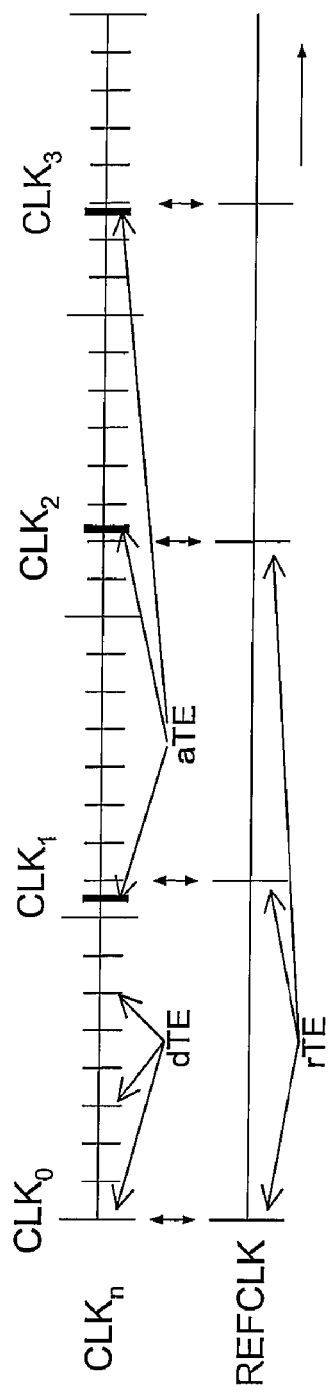
FIG. 2b shows a schematic timing diagram of the multi-phase clock system of FIG. 2a, which illustrates the operating principle of the second embodiment of the invention.

Referring to FIGS. 2a and 2b, FIG. 2a shows a multi-phase clock system in accordance with a second embodiment of the invention and FIG. 2b repeats the timing diagram which illustrates the operating principle of the second embodiment of the invention as illustrated in FIG. 2a. The difference between this embodiment and the first embodiment is that the multi-phase clock is now generated by a multi-phase oscillator MPOSC forming part of the clock system. The multi-phase oscillator MPOSC generates a plurality of clock signals $CLK_n$ having adjustable phases. The multi-phase oscillator MPOSC produces corrected clock phases $CLK_n'$ on its outputs. Effectively, the multi-phase oscillator in FIG. 2a comprises de-skew functionality. Similar to the embodiment shown in FIGS. 1a and 1b, in the multi-phase clock system of FIG. 2a, the individual clock phases CLKx' are compared to the reference clock signal REFCLK for producing a corresponding timing difference indicators PHADJ after each comparison which is supplied to the multi-phase oscillator MPOSC for adjusting the actual time events aTE of the respective clock signals to their desired time events dTE.

Figure 3:
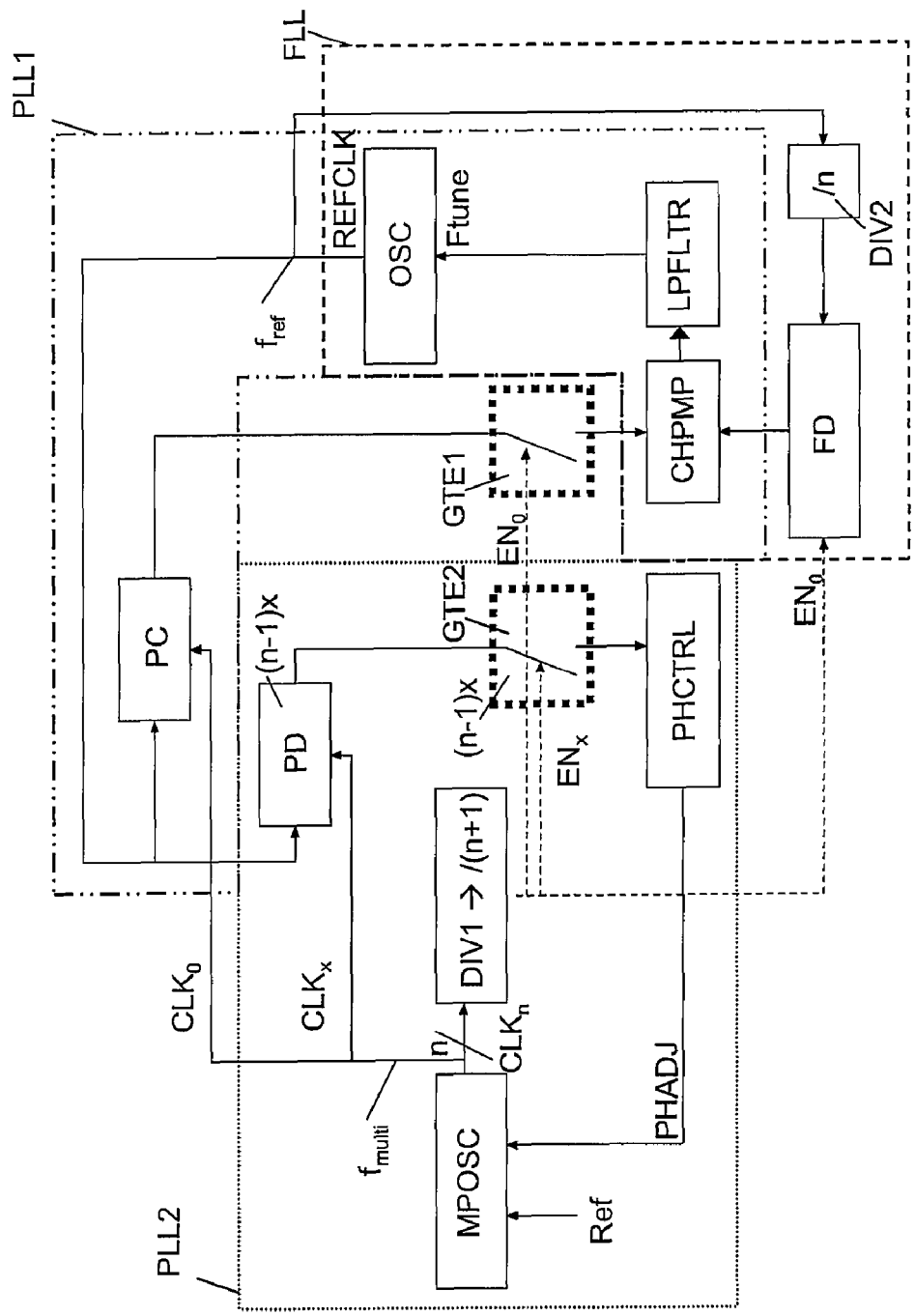
FIG. 3 shows a detailed implementation of the multi-phase system in accordance with a third embodiment of the invention.

Referring to FIG. 3, this Figure shows a detailed implementation of the multi-phase clock system in accordance with a third embodiment of the invention. In this embodiment a multi-phase oscillator MPOSC is implemented which produces a multi-phase clock $CLK_n$ running at a specific clock frequency $f_{multi}$ and a reference oscillator OSC which produces a reference clock REFCLK running at a reference frequency $f_{ref}$. The reference oscillator OSC is kept at the correct frequency by means of a frequency-locked loop FLL. Frequency locked-loops and their operation are known to the person skilled in the art, see for instance, A. Pottbäcker, U. Langmann, and H.-U. Schreiber., "*A Si bipolar phase and frequency detector IC for clock extraction up to 8 gb/s*", JSSC, vol. 27, No. 12, December 1992, p. 1747-1751.

The frequency-locked loop FLL comprises a frequency detector FD which compares a first signal $EN_0$ generated by a first divider DIV1 having a frequency of $f_{multi}/(n+1)$ with a second signal generated by a second divider DIV2 having a frequency of $f_{ref}/n$ and produces a frequency difference indicator. The frequency-locked loop FLL further comprises a charge pump CHPMP, which is controlled by the frequency detector and a loop filter which drives the oscillator. As a consequence of the frequency ratios of the dividers DIV1 and DIV2 the resulting frequency of the reference oscillator OSC is $f_{ref}=f_{multi}\cdot n/(n+1)$. A designer may provide any reference frequency by providing dividers having different frequency ratios.

Apart from matching the reference frequency $f_{ref}$ to a fixed factor times the clock frequency $f_{multi}$, it is also advantageous to align the phase of the reference clock REFCLK to one of the phases of the multi-phase clock $CLK_n$ at at least one reference time event rTE. Even better, this matching could be done at a plurality of reference time events rTE, for example at each reference time event rTE at which the reference clock REFCLK coincides with the desired time event dTE of the one of the phases of the multi-phase clock $CLK_n$. In FIG. 3 this is implemented by a first phase-locked loop PLL1 which is, in this embodiment, formed by the mentioned charge pump CHPMP, the loop filter LPFLTR, reference oscillator OSC and a phase comparator PC. The phase comparator PC compares the first one of the phases $CLK_0$ of the multi-phase clock $CLK_n$ with the reference clock REFCLK and produces a timing difference indicator, which controls the charge-pump CHPMP which closes the loop of the phase-locked loop. The output of the phase comparator PC is gated by a first gating circuit GTE1 in order to facilitate that the first phase-locked loop PLL1 only acts at those reference time events RTE of the reference clock at which they coincide with the desired time events dTE of the first one of the phases $CLK_0$ of the multi-phase clock $CLK_n$. The first output $EN_0$ of the first divider DIV1 may advantageously be used as a gating signal for the first gating circuit GTE1. In that case the first phase-locked loop PLL1 is only closed around the desired time event dTE for the first one of the phase $CLK_0$ of the multi-phase clock $CLK_n$.

It must be noted that a frequency-lock-loop may be designed such that once the reference frequency is locked by the FLL the frequency difference indicator is zero and the FLL becomes inactive, which also has the advantage that the frequency detector does not disturb the loop or add noise.

If a suitable PLL is used for phase locking phase 0 of the multi-phase oscillator to the reference oscillator OSC, the steady-state phase error between the two will be 0.

Once phase lock is achieved between the reference oscillator OSC and the first one of the phases $CLK_0$, the phase of the reference oscillator OSC may be compared to each of the other phases $CLK_x$. In FIG. 3 this is implemented by a plurality (n−1) of phase detectors PD which are arranged for comparing the reference clock REFCLK with another one of the plurality of clock signals $CLK_x$ and for producing a plurality of timing difference indicators. The plurality of timing difference indicators are fed into a phase control unit PHCTRL which unit is arranged for individually controlling the phases $CLK_x$ of the multiphase clock $CLK_n$. It is important that, if only one of the clock signals needs adjustment of its phase, the other clock phases remain unchanged. Since adjusting one of the phases of the multi-phase oscillator is likely to influence the timing of other phases, an iterative algorithm for adjusting all phases is probably best.

The above-mentioned functionality may be arranged for by the phase control unit PHCTRL. Alternatively, the phase control unit functionality may be integrated into the multi-phase oscillator MPOSC, which renders this block superfluous. In actual fact the multi-phase oscillator MPOSC, each of the phase detectors PD, and the phase control unit PHCTRL form a second phase-locked loop PLL2. This second phase-locked loop comprises a plurality (n−1) of phase-locked loops, which are sequentially activated.

The outputs of the phase detectors PD are, in this embodiment, gated by a second gating circuit GTE2 in order to facilitate that the second phase-locked loop PLL2 only acts at those reference time events RTE of the reference clock at which they coincide with the desired time events dTE of the remainder of the phases $CLK_{1-n}$ of the multi-phase clock $CLK_n$. The remainder of the outputs $EN_{1-x}$ of the first divider DIV1 may advantageously be used as a gating signal for the second gating circuit GTE2. In that case the second phase-locked loop PLL2 is subsequently closed around the desired time events dTE for remainder of the phases $CLK_{1-n}$ of the multi-phase clock $CLK_n$.

The information coming from the phase detector PD can be used to deduce whether the phase of the multi-phase oscillator is early or late, and can be adjusted appropriately. In this embodiment, the phase comparison between each of the plurality of clock signals $CLK_n$ of the multi-phase oscillator MPOSC and the reference oscillator OSC is done once every n+1 multi-phase oscillator periods $T_{multi}$.

Figure 4:
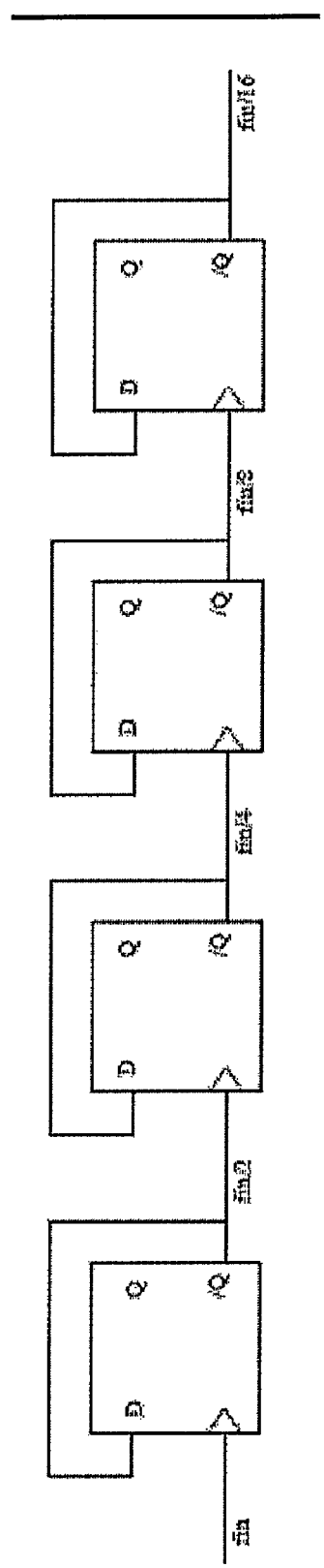
FIG. 4 shows an embodiment of a divide-by-n circuit, wherein n equals an exponent of 2.

FIG. 4 shows an embodiment of a divide-by-n circuit, which may be used in the embodiment of the multi-phase clock system of FIG. 3, wherein n equals an exponent of 2, in this example 16. In that case the divide-by-n circuit may be a simple chain of D-flip-flops DFF. Each stage (D-flip-flop) divides the frequency by 2. As a result, after 4 stages, the frequency is divided by 16. Since the output of the frequency divider DIV1 in FIG. 3 is only used for frequency detection, skew caused by delay in the chain of flip-flops is not a problem. As far as the frequency detector in FIG. 3 is concerned, I and Q outputs can be readily generated at the output of the divider of FIG. 5, allowing the use of the simple and effective frequency detector as disclosed in A. Pottbäcker, U. Langmann, and H.-U. Schreiber., "*A Si bipolar phase and frequency detector IC for clock extraction up to 8 gb/s*", JSSC, vol. 27, No. 12, December 1992, p. 1747-1751.

Figure 5:
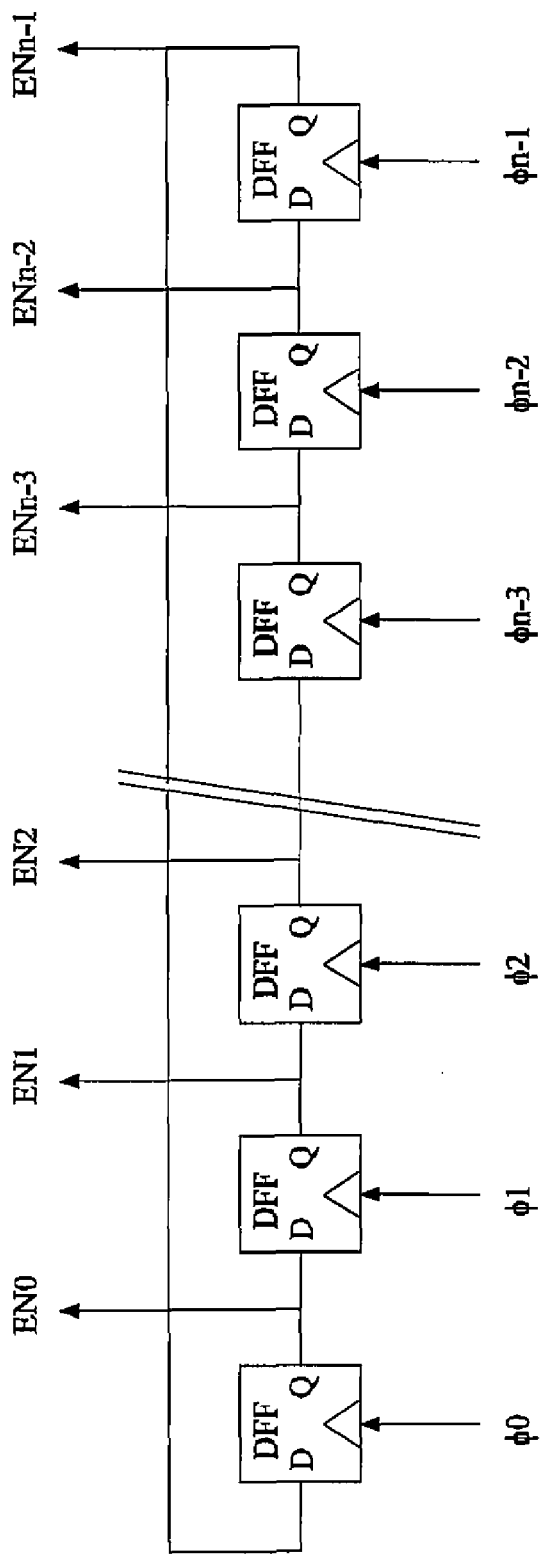
FIG. 5 shows an embodiment of a divide-by-n+1 circuit.

FIG. 5 shows an embodiment of a divide-by-n+1 circuit, which may be used in the embodiment of the multi-phase clock system of FIG. 3. If the number of clock phases n is chosen such that n+1 equals a power of 2, the divide-by-n circuit can be a simple chain of D-flip-flops DFF as illustrated in FIG. 4. Where n+1 does not equal a power of 2 a different circuit is required. The multi-phase clock system in FIG. 3 also requires the generation of gating signals. FIG. 5 shows a simple circuit that performs both tasks (divide by n+1 and generation of gating signals). The circuit comprises a looped chain of D-flip-flops DFF, which are resettable, which are each clocked by a subsequent clock phase $\phi_x$ (x=0, 1, 2 ... n−1). The consequence of the shifted phases of the clocks $\phi_x$ (x=0, 1, 2 ... n−1) is that the frequency of the outputs of each of the flip-flops DFF runs at a frequency of 1/n+1 times the input frequency. The outputs of the flip-flops DFF are directly suitable for use as gating signals $EN_x$ for the gating circuits (and for feeding into the frequency detector of the frequency-locked loop FLL). The circuit of FIG. 5 only works if the timing difference between subsequent clock phases is small. This is explained by the formula $$\Delta CK < Tpd + Tsu,$$

wherein ΔCK is the time difference between subsequent clock phases, Tpd is the propagation delay of the flip-flop, and Tsu is the setup time of the flip-flop.

It is not difficult to satisfy this requirement, since ΔCK will typically be small (or there would be no need for an interleaved system in the first place), and it is not difficult to make the D-flip-flop slow enough (Tsu large enough) to satisfy the timing requirement.

Figure 6:
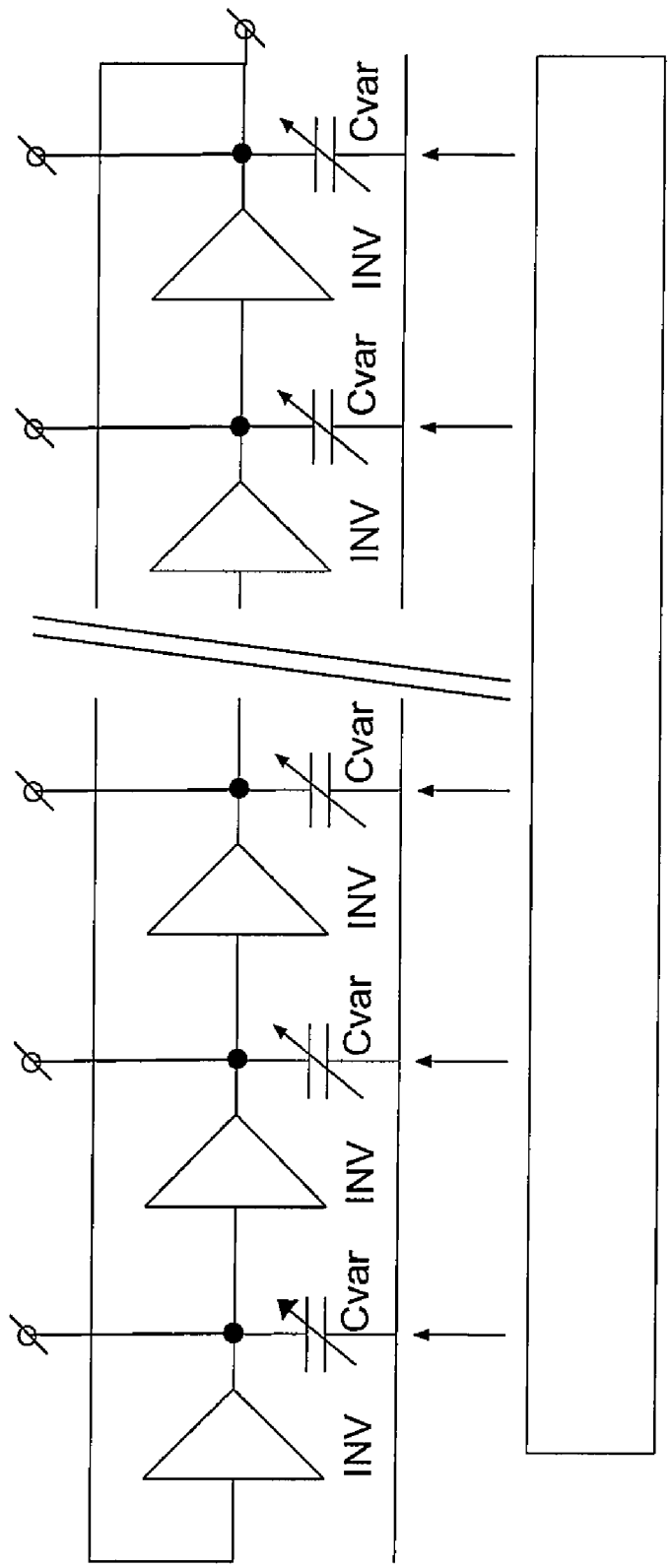
FIG. 6 shows a multi-phase oscillator comprising a conventional ring-oscillator having controllable node capacitances.

FIG. 6 shows a multi-phase oscillator comprising a conventional ring-oscillator having controllable node capacitances. The multi-phase oscillator comprises a looped chain of inverters INV. This oscillator is suitable for generating multi-phase clocks $CLK_n$ having an uneven number of distributed clock phases (n=3, 5, 7, . . . ). Varying the phase of a stage in a ring oscillator can be done in a variety of ways. A varactor Cvar could be added to each stage of a ring oscillator as illustrated in FIG. 6. This would allow the delay of each stage to be individually tuned. As mentioned earlier, it may be desirable to change the timing of one phase without changing the period of the oscillator. In that case, changing the delay of one stage should be accompanied by an equal and opposite adjustment of the delay of another stage. The phase control unit PHCTRL could take care of generating the required steering signals for the varactors Cvar.

Figure 7:
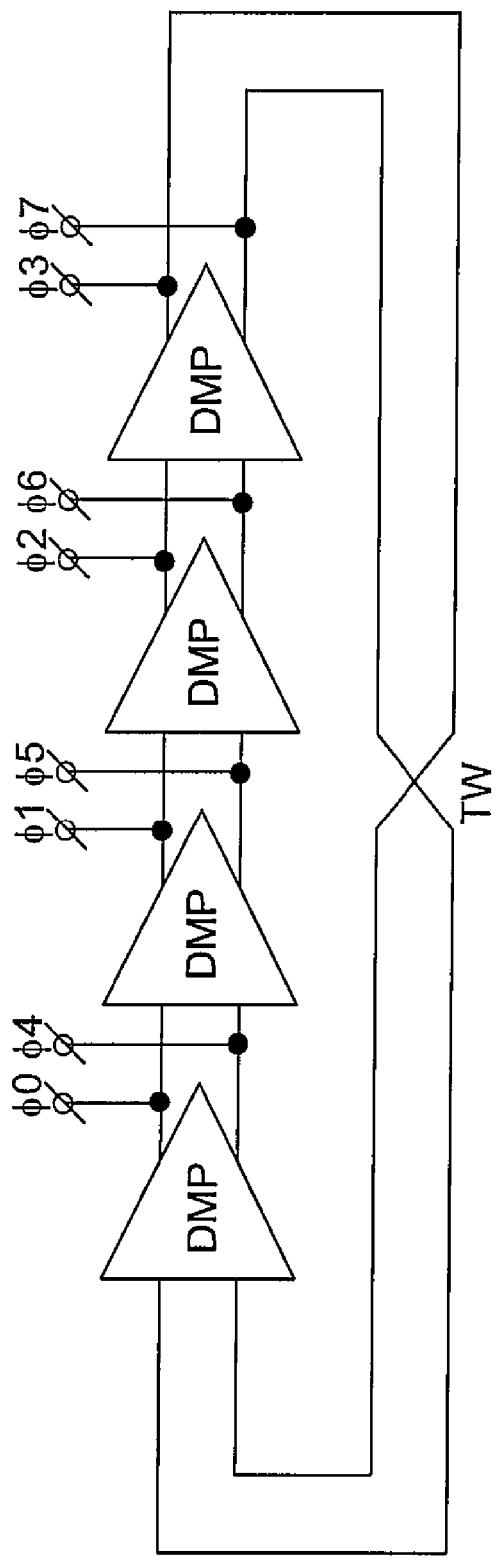
FIG. 7 shows a multi-phase oscillator comprising a 4-stage differential ring-oscillator.

FIG. 7 shows a multi-phase oscillator comprising a 4-stage differential ring-oscillator. Such ring-oscillators are well-known to the skilled person and disclosed in, for example, L. Wu and J. William C. Black. "*A low-jitter skew-calibrated multi-phase clock generator for time-interleaved applications*", Proceedings of the ISSCC, 2001, page 25.3. The differential ring-oscillator in FIG. 7 comprises four differential amplifiers DMP connected in a loop, wherein the interconnection from the last stage to the first stage comprises a twist TW. The ring-oscillator produces 8 distributed clock-phases $\phi 0$-$\phi 7$. Please note that for a full clock-cycle of the multi-phase clock the loop must be went through twice.

Figures 8, 9:
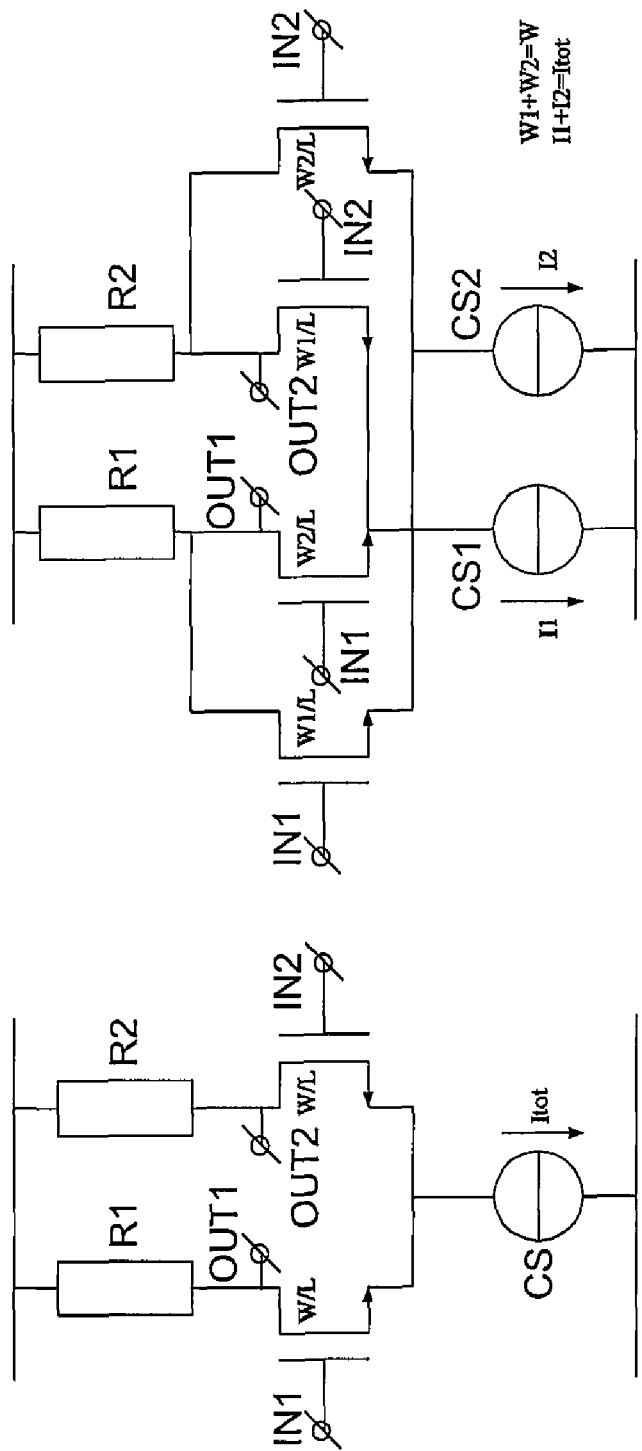
FIG. 8 shows an implementation of a conventional stage of a differential ring-oscillator.
FIG. 9 shows an implementation of a programmable stage of a differential ring-oscillator.

FIG. 8 shows an example implementation of a conventional stage of a differential ring-oscillator. It comprises a differential amplifier having two transistors T1, T2 with equal dimensions W/L and equal load R1, R2. In this implementation the delay may not be controlled. The current Itot flowing through the current source CS determines the gain of the amplifier. The current source may, for example, be a voltage controlled-current source. The differential stage of FIG. 8 produces two delays. Both these delays are so-called 'crossing-to-crossing' delays. The first delay is defined from the time that the voltages on the inputs IN1, IN2 are equal, wherein, IN1 is falling and IN2 is rising, to the time that the voltages on the outputs OUT1, OUT2 are equal, wherein OUT1 is rising and OUT2 is falling.

The second delay is defined from the time that the voltages on the inputs IN1, IN2 are equal, wherein, IN1 is rising and IN2 is falling, to the time that the voltages on the outputs OUT1, OUT2 are equal, wherein OUT1 is falling and OUT2 is rising. In the implementation of FIG. 8, the two delays are equal.

FIG. 9 shows an implementation of a programmable stage of a differential ring-oscillator. Its basic structures consists of a differential amplifier as illustrated in FIG. 8, where the differential pair is split into two asymmetrical differential pairs that are connected in a mirrored fashion, and are both equipped with a current source CS1, CS2. The delay of the stage can be tuned by varying the ratio of I1 and I2 of the current sources CS1, CS2. If the sum of I1 and I2 is chosen the same as Itot in FIG. 8, the stage will advantageously increase one of the delays it produces, while simultaneously decreasing the other delay it produces. This facilitates changing the timing of 2 clock phases (for example $\phi 0$ and its counterpart $\phi 5$) of the stage without changing the period of the multi-phase clock.

Figure 10:
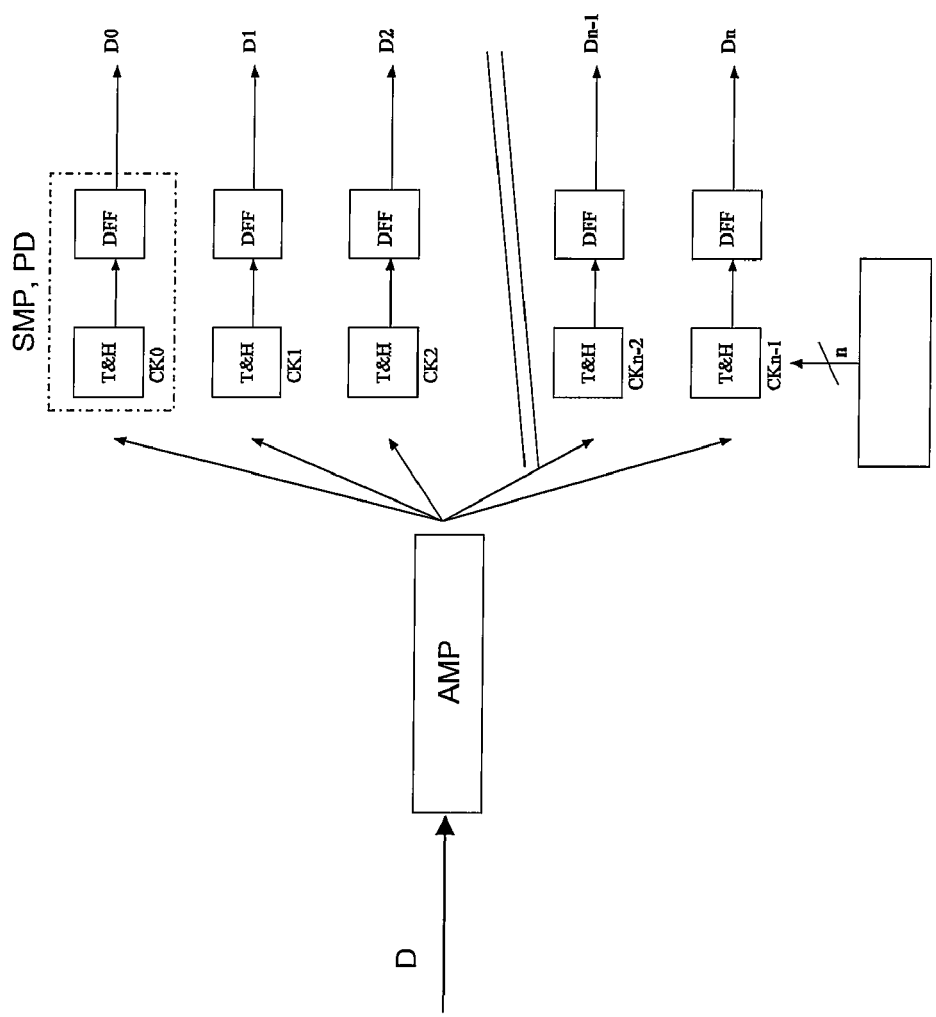
FIG. 10 shows a clock-and-data-recovery system receiving a multi-phase clock in accordance with the invention.

FIG. 10 shows a clock-and-data-recovery system receiving a multi-phase clock. Data D is provided to an amplifier where after it is provided to a plurality of sampling units SMP, each sampling unit comprising a track-and-hold circuit T&F and a D-flip-flop DFF. Since the interleaved clock-and-data-recovery (CDR) circuit already comprises phase detectors (comprising the Track & Hold T&H and D-flip-flop DFF) for every channel, it is advantageous to combine this with the multi-phase clock system of the invention, because the phase detectors may be reused. An important advantage of this CDR implementation is that all clock skew of the whole CDR (not only in the oscillator core, but also in the layout and the T&H drivers) can now be calibrated out since the clock is calibrated at its 'point of use'. Expressed differently, all clock phase variation before this point is removed by the calibration.

The invention thus provides, in a first aspect, a new system for receiving a plurality of clock signals. The multi-phase clock system of the invention is particularly suitable for high-speed operation, because the accuracy of the clock phases is determined by the accuracy of the frequency of the reference clock. It facilitates accurate measurement and adjustment of very short time intervals without directly measuring this time interval, but rather relying on frequency accuracy of an oscillator. Applications, which are envisaged comprise time-interleaved systems, like a clock-and-data-recovery (CDR) circuit, an analog-to-digital converter or a digital-to-analog converter. In CDR applications the required overhead for this technique may be very limited, because many blocks may already be present, like the phase detectors for every channel. The multi-phase clock system could, however, be applied in other applications where an accurate multi-phase clock is required. No external components are required, and the method can be implemented on-die at low cost.

According to the second aspect of the invention, a new method of de-skewing a plurality of clock signals comprising actual time events defining different clock phases, the clock signals all having a same clock frequency but different clock phases, is provided.

Various variations of the multi-phase clock system in accordance with the invention are possible. For example, the multi-phase clock system may provide for introducing intentional skew after producing a uniformly distributed multi-phase clock. This may be useful for relaxing time constraints in certain data paths or circuits.

Another variation concerns the multi-phase oscillator, which may in some embodiments be implemented in the system itself This oscillator may still be locked to an external reference clock in order to ensure that the system is synchronized with any possible external clocks.

The invention claimed is:

1. A multi-phase clock system for receiving a plurality of clock signals comprising actual time events defining different clock phases, the clock signals all having a same clock frequency but different clock phases, the system further being arranged for receiving a reference clock signal for providing reference time events for the clock signals, the reference clock signal having a reference frequency different from the clock frequency, the reference frequency being selected such that each one of the subsequent reference time events coincides with a desired time event for a single one of the clock signals, the system comprising:
    a comparator arranged for sequentially comparing corresponding ones of the reference time events and the actual time events for sequentially generating a plurality of timing difference indicators, and
    a de-skew circuit for de-skewing a corresponding one of the clock signals with respect to the reference clock signal in response to the corresponding timing difference indicator to obtain corrected clock signals having actual time events coinciding with the corresponding reference time events.

2. A multi-phase clock system as claimed in claim 1, wherein the comparator comprises a phase comparator for at least once comparing the phase of one of the clock signals and the phase of the reference clock signal, and comprises a phase shifter for at least once subsequently matching the phase of the reference clock signal with the phase of the one of the clock signals.

3. A multi-phase clock system as claimed in claim 1, wherein the system further comprises a reference oscillator for generating the reference clock signal.

4. A multi-phase clock system as claimed in claim 3, wherein the comparator comprises a phase comparator for at least once comparing the phase of one of the clock signals and the phase of the reference clock signal and comprises a phase shifter for at least once subsequently matching the phase of the reference clock signal with the phase of the one of the clock signals,
    wherein the system further comprises a phase-locked loop comprising the reference oscillator, the phase comparator and the phase shifter, the phase comparator being arranged for comparing the reference clock signal to one of the clock signals for generating one of the timing difference indicators, the phase shifter comprising a controller for tuning the reference oscillator in response to the one of the timing difference indicators.

5. A multi-phase clock system as claimed in claim 4, wherein the controller comprises a charge pump and a loop filter, the charge pump receiving the further timing difference indicator from the phase comparator, the loop filter receiving an output signal from the charge pump and producing a reference control signal for tuning the reference oscillator.

6. A multi-phase clock system as claimed in claim 5, wherein the system further comprises a gating circuit arranged between an output of the phase comparator and the charge pump for facilitating matching of the phase of the reference clock signal with the phase of the one of the clock signals at the at least one of the reference time events.

7. A multi-phase clock system as claimed in claim 1, wherein the system further comprises an element for measuring the clock frequency of one of the clock signals and fixing the reference frequency to a fixed factor times the clock frequency.

8. A multi-phase clock system as claimed in claim 7, wherein the element for fixing the reference frequency comprises a frequency-locked loop comprising a frequency difference detector arranged for comparing a first frequency with a second frequency for generating a frequency difference indicator, the frequency-locked loop further comprising a further controller for tuning the frequency of the reference oscillator in response to the frequency difference indicator, the system further comprising a divider for generating the first frequency having a first integer ratio with the clock frequency of one of the clock signals, and a further divider for generating the second frequency having a second integer ratio with the reference frequency, wherein a ratio of the first integer ratio and the second integer ratio determines the fixed factor.

9. A multi-phase clock system as claimed in claim 1, wherein the system further comprises a multi-phase oscillator for generating the clock signals.

10. A multi-phase clock system as claimed in claim 9,
    wherein the comparator comprises a phase comparator for at least once comparing the phase of one of the clock signals and the phase of the reference clock signal, and comprises a phase shifter for at least once subsequently matching the phase of the reference clock signal with the phase of the one of the clock signals, and
    wherein the comparator further comprises a plurality of phase detectors for the remainder of the clock signals which are not connected to the phase comparator, each phase detector being arranged for detecting a phase difference between the respective clock signal and the reference clock signal for producing the timing difference indicators.

11. A multi-phase clock system as claimed in claim 10, wherein the de-skew circuit comprises a phase control unit arranged for individually controlling the phases of the multi-phase oscillator in response to the plurality of timing difference indicators, wherein the multi-phase oscillator, the phase detectors and the phase control unit form a further phase-locked loop, wherein the reference clock signal that is provided to the phase detectors is used as the reference signal for the further phase-locked loop.

12. A multi-phase clock system as claimed in claim 11, wherein the system comprises a further gating circuit arranged between each output of the phase detectors and the phase control unit for facilitating the sequential comparison and de-skewing of the clock signals.

13. A multi-phase clock system as claimed in claim 1, wherein the reference frequency is lower than the clock frequency of the clock signals.

14. A multi-phase clock system as claimed in claim 13, wherein the reference frequency equals the clock frequency of the clock signals multiplied by $n/(n+1)$, wherein n represents the number of clock signals.

15. A multi-phase clock system as claimed in claim 1, wherein the reference frequency is higher than the clock frequency of the clock signals.

16. A multi-phase clock system as claimed in claim 15, wherein the reference frequency equals the clock frequency of the clock signals multiplied by $(n+1)/n$, wherein n represents the number of clock signals.

17. A time-interleaved system comprising the multi-phase clock system as claimed in claim 1 for providing a multi-phase clock, and a processing unit for receiving the multi-phase clock.

18. A time-interleaved system as claimed in claim 17, wherein the system further comprises a clock-and-data-recovery circuit arranged for receiving the multi-phase clock.

19. A time-interleaved system as claimed in claim 17, wherein the system further comprises one of an analog-to-digital converter and a digital-to-analog converter for receiving the multi-phase clock.

20. A method of de-skewing a plurality of clock signals comprising actual time events defining different clock phases, the clock signals all having a same clock frequency but different clock phases, the method comprising the steps of:

receiving a reference clock signal for providing reference time events for the clock signals, the reference clock signal having a reference frequency different from the clock frequency, the reference frequency being selected such that each one of the subsequent reference time events coincide with a desired time event for a single one of the clock signals;

sequentially comparing corresponding ones of the reference time events and the actual time events for sequentially generating a plurality of timing difference indicators, and de-skewing a corresponding one of the clock signals with respect to the reference clock signal in response to the corresponding timing difference indicator to obtain corrected clock signals having actual time events coinciding with the corresponding reference time events.

\* \* \* \* \*